United States Patent [19]
Dempsey et al.

[11] Patent Number: 5,764,174
[45] Date of Patent: Jun. 9, 1998

[54] SWITCH ARCHITECTURE FOR R/2R DIGITAL TO ANALOG CONVERTERS

[75] Inventors: Dennis A. Dempsey; Michael Gerard Tuthill, both of Limerick; Martin Gerard Cotter, Ennis, all of Ireland

[73] Assignee: Analog Devices, Inc., Norwood, Mass.

[21] Appl. No.: 645,675

[22] Filed: May 14, 1996

[51] Int. Cl.$^6$ .................................................. H03M 1/78
[52] U.S. Cl. ........................................... 341/154; 341/136
[58] Field of Search ................................... 341/118, 119, 341/120, 121, 144, 153, 154, 136

[56] References Cited

U.S. PATENT DOCUMENTS

| | | | |
|---|---|---|---|
| 4,558,242 | 12/1985 | Tuthill et al. | 307/577 |
| 4,800,365 | 1/1989 | White et al. | 341/119 |
| 5,075,677 | 12/1991 | Meaney et al. | 341/136 |
| 5,387,912 | 2/1995 | Bowers | 341/144 |

OTHER PUBLICATIONS

Patent Abstracts of Japan, vol. 096, No. 007, 31 Jul. 1996 & JP 08 084078 A, 26, Mar. 1996.

*Primary Examiner*—Howard L. Williams
*Attorney, Agent, or Firm*—Wolf, Greenfield & Sacks, P.C.

[57] ABSTRACT

A switch architecture for a digital-to-analog converter provides improved linearity. A first switch for one leg of the R/2R resistance ladder includes a unit resistor coupled between the MOSFET devices of the switch and the respective leg of the R/2R ladder. The on resistances of the MOSFET devices of the first switch are controlled in response to a reference value, such as the resistance of a reference resistor, which may have a resistance and other characteristics similar to the unit resistor. Other switches for other legs of the R/2R ladder also have a unit resistor, or other MOSFET devices having an on resistance controlled in relation to the reference value. Additional switches for other legs of the R/2R ladder may also have MOSFET devices of varying width to channel (W/L) ratios. Each of these approaches may be combined to achieve a binary weighting or an alternate weighting between legs of the R/2R ladder, in order to provide low linearity error.

31 Claims, 10 Drawing Sheets

SWITCH ARCHITECTURE FOR R/2R DIGITAL TO ANALOG CONVERTERS

BACKGROUND OF THE INVENTION

1. Field of the Invention

This invention relates generally to digital-to-analog converters (DACs), and more particularly to an improved switch architecture for DACs.

2. Discussion of the Related Art

Figure 1:
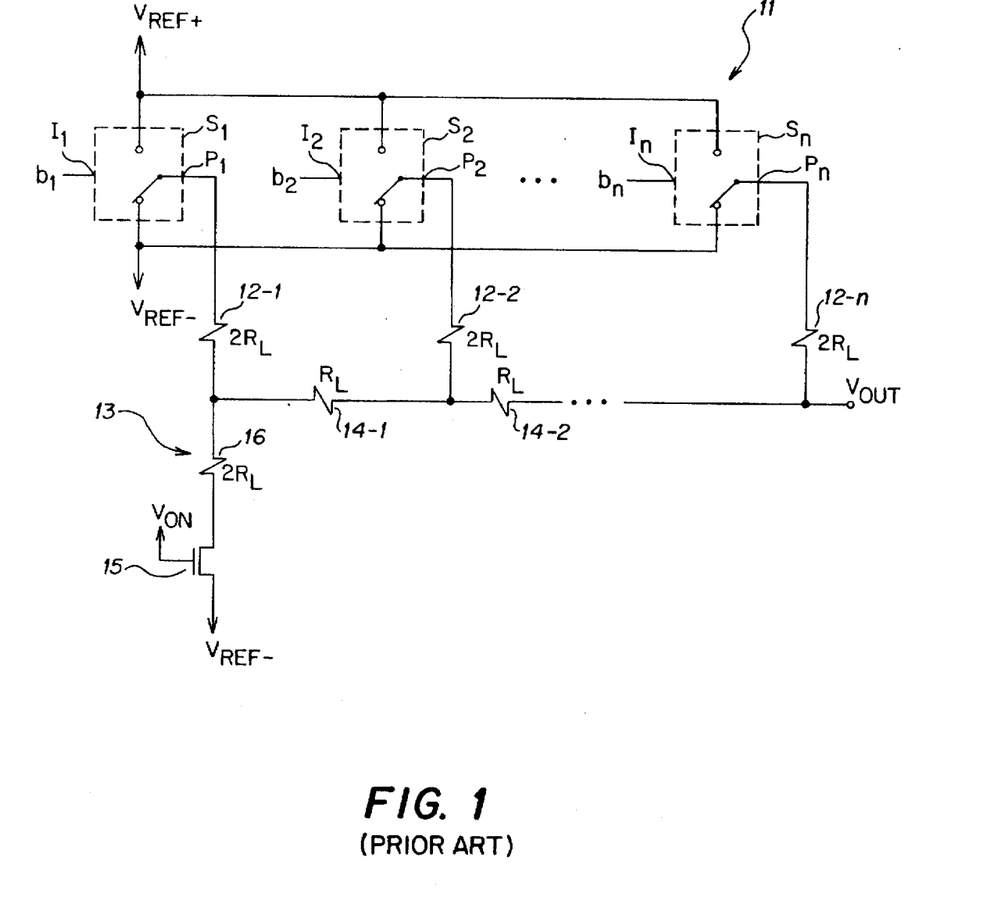
FIG. 1 illustrates the structure of a prior art R/2R DAC with binary scaling.

Digital-to-analog converters (DACs) generate an analog signal (i.e., voltage or current) from an input binary word. A known DAC architecture is an R/2R type. FIG. 1 illustrates the structure of an R/2R type of DAC 11. This structure may also be implemented in conjunction with a weighted resistor DAC architecture, in which the circuitry of FIG. 1 would represent a series of unsegmented bits of a DAC. The DAC 11 includes several single-pole, double-throw switches $S_1$, $S_2$, ... $S_n$. One throw of each switch $S_i$ (where i=1, ... n) is connected to receive a first voltage reference, at a voltage Vref+; the other throw is connected to receive a second voltage reference, at a voltage Vref−; the input $I_i$ of each switch $S_i$ is connected to a binary input $b_i$; and the output pole $P_i$ of each switch $S_i$ is connected to a respective ladder leg at one end of a corresponding shunt resistor 12-i. Intermediate shunt resistors, for example between shunt resistor 12-2 and shunt resistor 12-n, are not shown on the drawing as the intermediate legs (or rungs) of the ladder are omitted to avoid obfuscation. The R/2R ladder is made up of shunt resistors 12-1, ... , 12-n and the intermediate shunt resistors, each having a resistance value $2R_L$; with adjacent pairs of shunt resistors coupled together by series resistors 14-1, ... , 14-(n−1), each of resistance value $R_L$; and a termination leg resistor 16 of resistance value $2R_L$. Intermediate series resistors, in series with series resistors 14-1 and 14-2 also are not shown on the drawing. Each ladder leg i (where i=1, ... n−1) provides a weighted current to the output terminal Vout, through the series ladder resistors 14-1, ... , 14-(n−1) while the current through resistors 12-n is provided directly to the output terminal. Each switch $S_i$ receives a binary input $b_i$, which controls the switch $S_i$ to connect the output pole $P_i$ thereof to either a first reference source Vref− or to a second reference source Vref+, depending on the value of $b_i$. In operation, the DAC 11 of FIG. 1 generates an output voltage Vout in the range of Vref− to Vref+, depending upon the values of the binary inputs $b_1, b_2, \ldots b_n$. The transfer function of an ideal DAC can be represented algebraically by the following:

$$Vout = Vref- + (Vref+ - Vref-) * \Sigma b/2^i; \text{ where } i=1 \ldots n. \quad (1)$$

Two important characteristics of DACs are integral non-linearity (INL) and differential non-linearity (DNL). INL is the maximum deviation at any point in the transfer function of a DAC, of the actual output level from its ideal value. DNL is the maximum deviation of an actual analog output step between adjacent input codes (i.e., binary values of binary inputs $b_1, b_2, \ldots b_n$), from the ideal step size based on the gain of the particular DAC. (For a further discussion, see Analog Devices Staff, *Analog-Digital Conversion Handbook* (3rd ed. 1986), at 300–07, incorporated by reference herein).

In practice, each of the single-pole, double-throw switches $S_i$ typically is implemented as a pair of complementarily-driven MOSFET devices. An NMOS/NMOS DAC is a DAC in which both MOSFET devices of each switch $S_i$ are NMOS-type MOSFET devices, and a PMOS/NMOS DAC is a DAC in which an NMOS MOSFET device is coupled to the first, negative reference Vref−, and a PMOS MOSFET device is coupled to the second, positive reference Vref+. Similarly, a PMOS/PMOS DAC includes two PMOS MOSFET devices in each switch $S_i$. Ideally, each MOSFET device, whether in an NMOS/NMOS DAC, a PMOS/NMOS DAC, or a PMOS/PMOS DAC, would have a "on" resistance of zero, so that an ideal 2:1 output ratio is maintained between adjacent switches of an R/2R DAC. An ideal 2:1 output ratio means that the activation of each switch $S_i$ of next-higher significance will result in an addition to the output of twice the voltage contributed by the activation of the next-less significant adjacent switch $S_{i-1}$, as represented in equation (1).

However, ideal MOSFET devices cannot be fabricated, and each MOSFET device has a finite on resistance, rather than zero resistance. While this resistance is small, it is not inconsequential and its finite value can affect DAC accuracy. To minimize error and provide high accuracy DACs using these non-ideal MOSFET devices, in a DAC 11 having a structure such as that shown in FIG. 1 that has the single permanently on MOSFET device 15 in the termination leg 13, it is desirable to scale binarily the on resistances of each pair of MOSFET devices of a switch $S_i$ with respect to the pair of MOSFET devices of adjacent switches $S_{i-1}$ and $S_{i+1}$, and to match the on resistances of the two MOSFET devices within each switch $S_i$.

Figure 2:
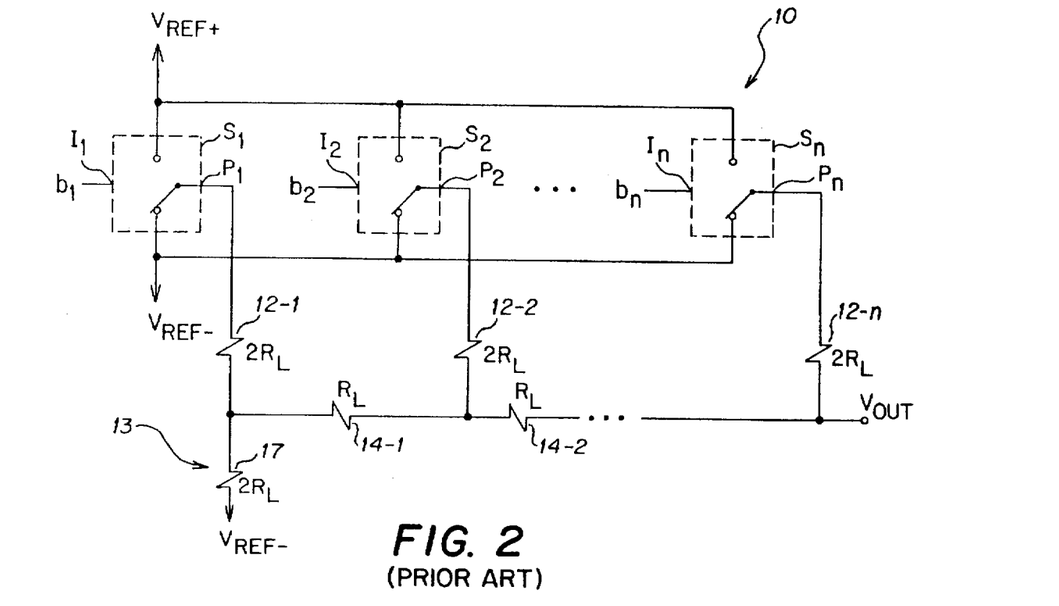
FIG. 2 illustrates the structure of a prior art R/2R DAC with alternate scaling.

FIG. 2 shows an alternative to the binary scaling of the on resistances of the MOSFET devices. In FIG. 2, the single permanently on MOSFET device 15 of FIG. 1 is not present in the DAC 10, and the termination leg 13 of the R/2R resistance ladder is coupled directly to Vref− through load resistor 17 having a value $R_L$. In such an arrangement, in order to maintain a 2:1 ratio between adjacent switches of the DAC, the on resistance of the MOSFET devices of each switch $S_i$ may be a relationship other than a binary relationship. An alternative scaling scheme such as shown in FIG. 2 may be advantageous to reduce the adverse effects of MOSFET device interaction, discussed in more detail below.

In order to scale the on resistance of each bit, either for binary scaling or an alternate scaling, it is known to provide multiple MOSFET devices in series, in parallel, or in a combination of series and parallel, with each gate of the multiple MOSFET devices being tied together. For example, the LSB (Least Significant Bit) switch $S_1$ may have four such devices, $S_2$ may have two such devices, and $S_3$ may have a single device. Another approach is to provide MOSFET devices of the different switches S with different ratios of the effective channel width to the effective channel length of each device, in order to adjust the effective on resistance of each MOSFET device. However, devices fabricated in accordance with these approaches are susceptible to MOSFET device interaction.

In general, MOSFET device interaction refers to the variation of on resistance among MOSFET devices, and may occur due to a series effect, a parallel effect, or a long-channel effect. A series effect refers to an instance in which several MOSFET devices are connected in series between two voltages. Ideally, each of the several MOSFET devices would have precisely the same on resistance when the gates of the several MOSFET devices are connected together and connected to a voltage reference to turn on the MOSFET devices. However, since each MOSFET device provides some finite amount of on resistance, then the drain-source voltage Vds of each MOSFET device in series will vary slightly, thus causing a variation in the gate-source voltage Vgs, which causes a variation in the on resistances among the MOSFET devices.

The manner in which the on resistance varies may be different for NMOS/NMOS DACs as opposed to PMOS/NMOS DACs. For example, for the NMOS devices that connect to the second voltage reference Vref– in either type of DAC, and for the PMOS devices that connect to the first voltage reference Vref+ in an PMOS/NMOS DAC, the on resistances of the MOSFET devices are higher for the devices that are farther away from the voltage reference Vref– or Vref+. This effect causes a positive feedback situation which then causes an even greater variation in Vgs, which in turn causes a greater variation in on resistance. However, for the NMOS devices that connect to the first voltage reference Vref+ in an NMOS/NMOS DAC, the situation is reversed, and the on resistance of the MOSFET devices are lower for the devices that are farther away from the first voltage reference Vref+. Although this situation causes less on resistance variation, there is more variation between the NMOS devices which connect to the first voltage reference Vref+ and the NMOS devices which connect to the second voltage reference Vref–.

A parallel effect is the variation of the source-drain voltage of a MOSFET device due to variations of the reference voltage (Vref+ or Vref–) as a result of switching between different codes of binary inputs $b_1, b_2, \ldots b_n$. This effect causes a variation of the on resistances of MOSFET devices in parallel, for example those of FIGS. 1 and 2 that are connected to Vref+ or Vref–, or MOSFET devices connected in a combination of series and parallel. For example, if a binary input code of 1101 (corresponding to $b_4$, $b_3$, $b_2$, $b_1$) is provided to the switches $S_{1-4}$ of a DAC, the effect of the three "1's" will be to draw current from the Vref+ voltage reference, which will affect the drain-source voltage Vds of the MOSFET devices of switch $S_2$. This causes a change in the drive voltage Vgs and the threshold voltage Vt of the MOSFET devices of switch $S_2$, which in turn causes a variation of on resistances of these devices. The next binary code, 1110, puts the switches in a different mode of interaction as the switches of the more significant bits are drawing current together from Vref+ but the switches of the less significant bits now source current together into Vref–. This change of interaction among the switches of the less significant bits causes the switch resistance to vary. Thus, there may be significant linearity error especially for adjacent input codes. The parallel effect is particularly significant toward the LSB end (near $b_1, b_2$) of the R/2R ladder.

The third type of MOSFET device interaction, called long-channel effect, is more prevalent in MOSFET devices having a low width-to-length (W/L) ratio, such as those used toward the LSB end of a DAC. These MOSFETs may suffer from long-channel effects where the part of the channel near the reference supply is not in saturation but the other end of the channel is in saturation. Because different parts of the channel have different characteristics, the on resistance typically varies.

Each type of MOSFET device interaction may compound the effects of the other types of MOSFET device interaction, making the variation of on resistance even greater. This variation of on resistance adversely affects both INL and DNL performance.

It would be desirable to provide an R/2R DAC switch architecture which is less susceptible to MOSFET device interaction.

SUMMARY OF THE INVENTION

An illustrative embodiment of the invention is directed to a circuit for providing switching of resistance legs of an R/2R resistance ladder of a digital to analog converter to a first voltage reference and a second voltage reference. In such an embodiment, the circuit comprises a plurality of switches, each of the plurality of switches including a first MOSFET device operable to couple the second voltage reference to the respective one of the resistance legs. The circuit further comprises a unit resistor coupling a first one of the plurality of switches to a first one of the resistance legs, and a control circuit that generates a first gate voltage that is provided to the first MOSFET device of the first of the plurality of switches, and to the first MOSFET device of a second of the plurality of switches, so that an on resistance of each of the first MOSFET devices of the first and second switches is controlled with respect to a reference value. The control circuit further generates a second gate voltage that is provided to the second MOSFET device of the first of the plurality of switches and to the second MOSFET device of the second of the plurality of switches, so that an on resistance of each of the second MOSFET devices of the first and second switches is controlled with respect to the reference value.

The control circuit may further include a comparison circuit for comparing the reference value to an on resistance of a MOSFET device that is a same type as the first MOSFET device, and a reference resistor, coupled to the comparison circuit, for providing the reference value to the comparison circuit. Additionally, the control circuit may further include a second reference resistor, coupled to the comparison circuit, for controlling the first gate voltage, and a third reference resistor, coupled to the comparison circuit, for controlling the second gate voltage. The first, second, and third reference resistors may be trimmable during manufacture of the circuit, or trimmable by a user.

The R/2R resistance ladder may include a termination leg having a permanently on transistor that couples the termination leg to the second voltage reference, and the on resistance of the first and second MOSFET devices may be controlled so that a total resistance of each switch of the plurality of switches is binarily weighted with respect to another of the plurality of switches.

In any embodiments, the first and second MOSFET devices may be NMOS devices, PMOS devices, transmission gates, or other equivalents.

Another embodiment of the invention is directed to a method for weighting resistance in a plurality of switches that each couples a respective resistance leg of an R/2R resistor ladder to a first voltage reference by a first MOSFET device, and that couples the respective resistance leg to a second voltage reference by a second MOSFET device, the method comprising the steps of: providing a unit resistor between a first switch of the plurality of switches and a corresponding respective resistor leg; controlling the on resistance of each of the MOSFET devices of the first switch to depend upon a resistance of the unit resistor, and controlling the on resistance of each of the MOSFET devices of a second switch of the plurality of switches to depend upon the resistance of the unit resistor.

In one embodiment, the first step of controlling includes the steps of: generating a unit resistance reference voltage across at least one reference resistor; generating a unit MOSFET reference voltage across at least one reference MOSFET device; adjusting a gate voltage of the at least one reference MOSFET device so that the unit resistance reference voltage is substantially equal to the unit MOSFET reference voltage; and providing the gate voltage to a gate of each of the MOSFET devices of the first switch.

Another embodiment of the invention is directed to an apparatus for weighting resistance in a plurality of switches that each couples a respective resistance leg of an R/2R resistor ladder to a first voltage reference by a first MOSFET device, and that couples the respective resistance leg to a second voltage reference by a second MOSFET device, the apparatus comprising: a unit resistor coupled between a first switch of the plurality of switches and a corresponding respective resistor leg; first means for controlling the on resistance of each of the MOSFET devices of the first switch to depend upon a resistance of the unit resistor, and second means for controlling the on resistance of each of the MOSFET devices of a second switch of the plurality of switches to depend upon the resistance of the unit resistor.

In one embodiment, the first means includes: means for generating a unit resistance reference voltage across at least one reference resistor; means for generating a unit MOSFET reference voltage across at least one reference MOSFET device; means for adjusting a gate voltage of the at least one reference MOSFET device so that the unit resistance reference voltage is substantially equal to the unit MOSFET reference voltage; and means for providing the gate voltage to a gate of each of the MOSFET devices of the first switch.

Another embodiment of the invention is directed to a switch for coupling a resistor leg of an R/2R resistor ladder to a first voltage reference and a second voltage reference according to a bit select signal. In this embodiment, the switch comprises: a first transistor having a first element connected to the first voltage reference, a second element, and a third element coupled to the resistor leg; a second transistor having a first element connected to the second voltage reference, a second element, and a third element connected to the third element of the first transistor; a first driver having an input that receives the bit select signal and an output connected to the second element of the first transistor; and a second driver having an input that receives the bit select signal and an output connected to the second terminal of the second transistor. In this embodiment, the first driver controls the first transistor to have an on resistance controlled to depend upon a reference value, and the second driver controls the second transistor to have an on resistance controlled to depend upon the reference value.

BRIEF DESCRIPTION OF THE DRAWINGS

Other features and advantages of the present invention shall appear from the following description of an exemplary embodiment, said description being made with reference to the appended drawings, of which.

DETAILED DESCRIPTION

Figure 3:
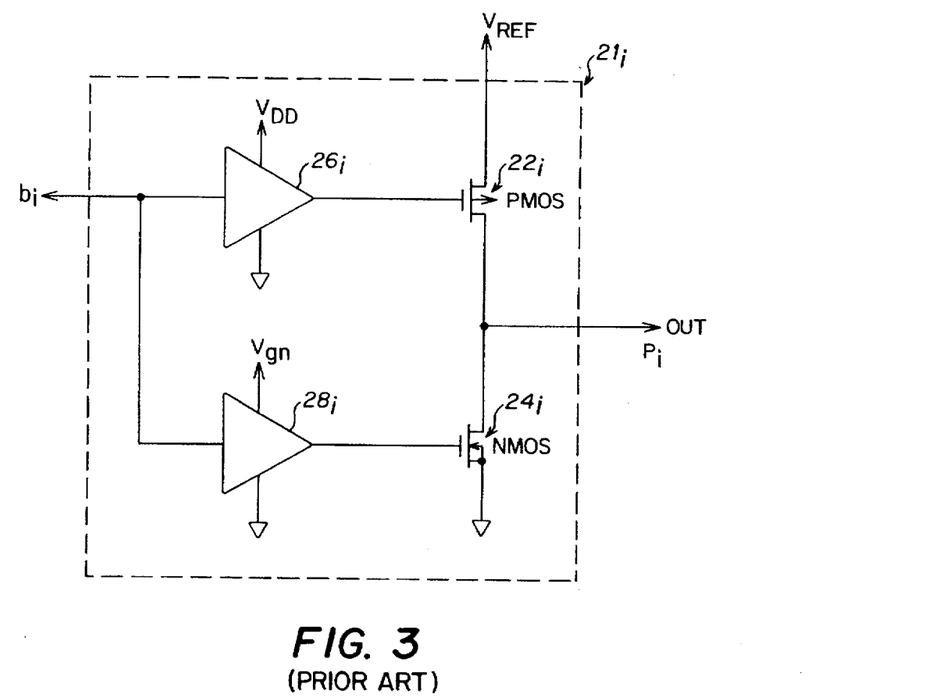
FIG. 3 illustrates a prior art circuit for implementing the switches within an R/2R DAC.

FIG. 3 shows an exemplary switch $21_i$ for the $i^{th}$ bit position in an R/2R DAC such as those shown in FIGS. 1–2. Switch $21_i$ has a p-channel MOSFET $22_i$ whose source is connected to Vref and an n-channel MOSFET $24_i$ whose source is connected to ground. The gate terminal of the p-channel MOSFET $22_i$ is driven by a first driver $26_i$, the output of which switches between a voltage approaching ground and a voltage approaching Vdd, depending upon the state of digital input $b_i$. The digital input $b_i$ is understood to represent any of the binary inputs (i.e., the $i^{th}$) that make up the digital word which is input to the DAC, and normally switches between ground and $V_{DD}$ voltage levels. The gate of the n-channel MOSFET $24_i$ is driven by a second driver $28_i$, the output of which switches between voltages approaching ground and Vgn voltage levels. The p-channel MOSFET $22_i$ is "on" with 0V applied to the gate, i.e. Vgs=−(Vref). The n-channel MOSFET $24_i$ is "on" with a high voltage applied to the gate, Vgs=Vgn.

Figure 4:
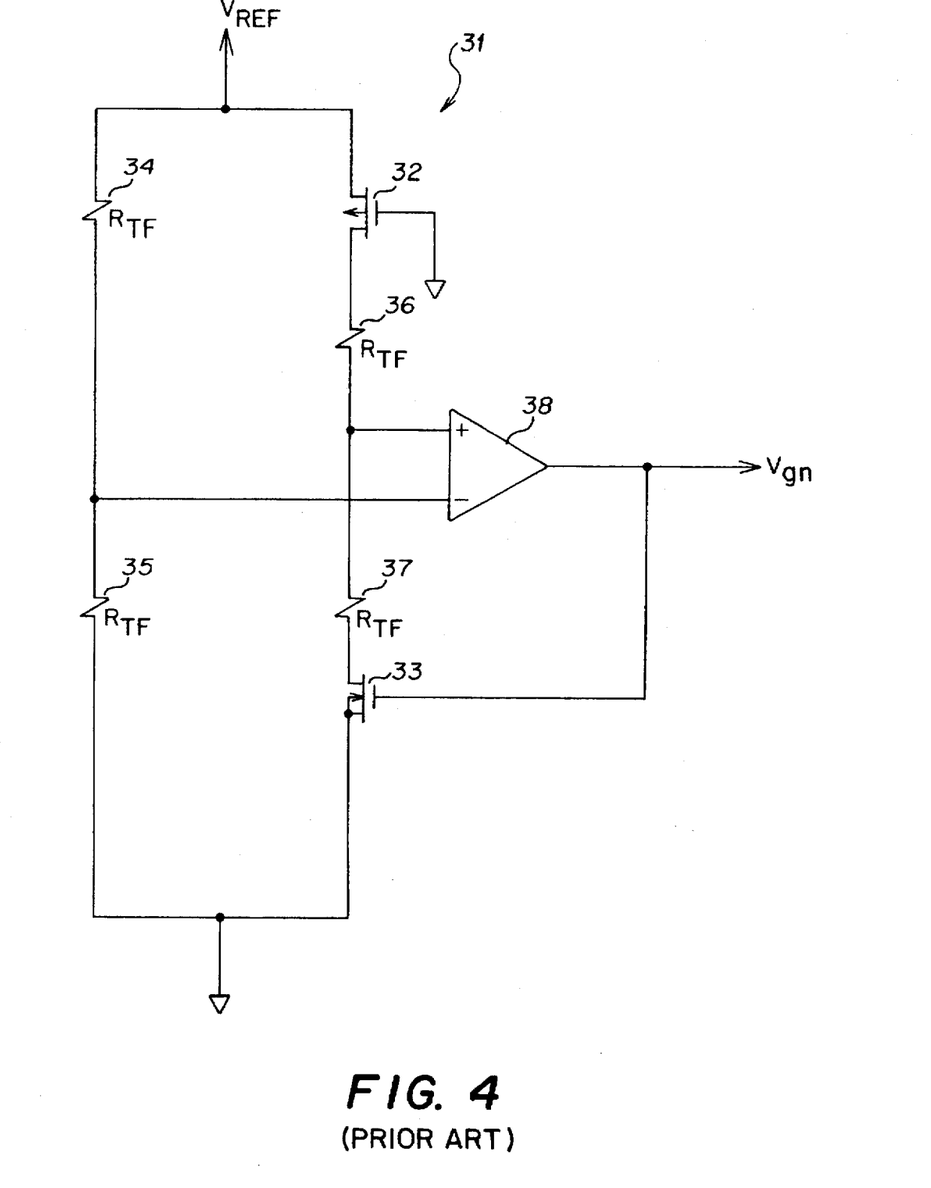
FIG. 4 illustrates a prior art circuit for generating the negative gate voltage for one of the drivers of the circuit of FIG. 3.

FIG. 4 shows a circuit 31 for generating the voltage Vgn which is used to power the driver $28_i$. A divider circuit between voltages Vref and ground is made up by resistors 34 and 35, which are matched to a precise tolerance. Another divider circuit is formed by a series connection of transistor 32 which is connected to Vref, resistor 37 connected to resistor 36, and transistor 33 connected between ground and resistor 37. Operational amplifier 38 has a non-inverted input that is connected to the node which connects resistor 36 to resistor 37, and an inverted input that is connected to the node which connects resistor 34 to resistor 35. The output of operational amplifier 38 is connected to the gate of transistor 33. The gate of transistor 32 is connected to ground. Transistor 32 is made with similar process control as that of p-channel MOSFET $22_i$, and transistor 33 is made with similar process control as that of n-channel MOSFET $24_i$. Accordingly, the operational amplifier 38 provides an output, Vgn, which assures that the on resistance of transistor 33 matches the on resistance of transistor 32. This output Vgn is also provided to the driver $28_i$ so that the on resistance of p channel MOSFET $22_i$ matches the on resistance of n channel MOSFET $24_i$. The circuits of FIGS. 3 and 4 are described in U.S. Pat. No. 5,075,677, which is hereby incorporated by reference.

Figure 5:
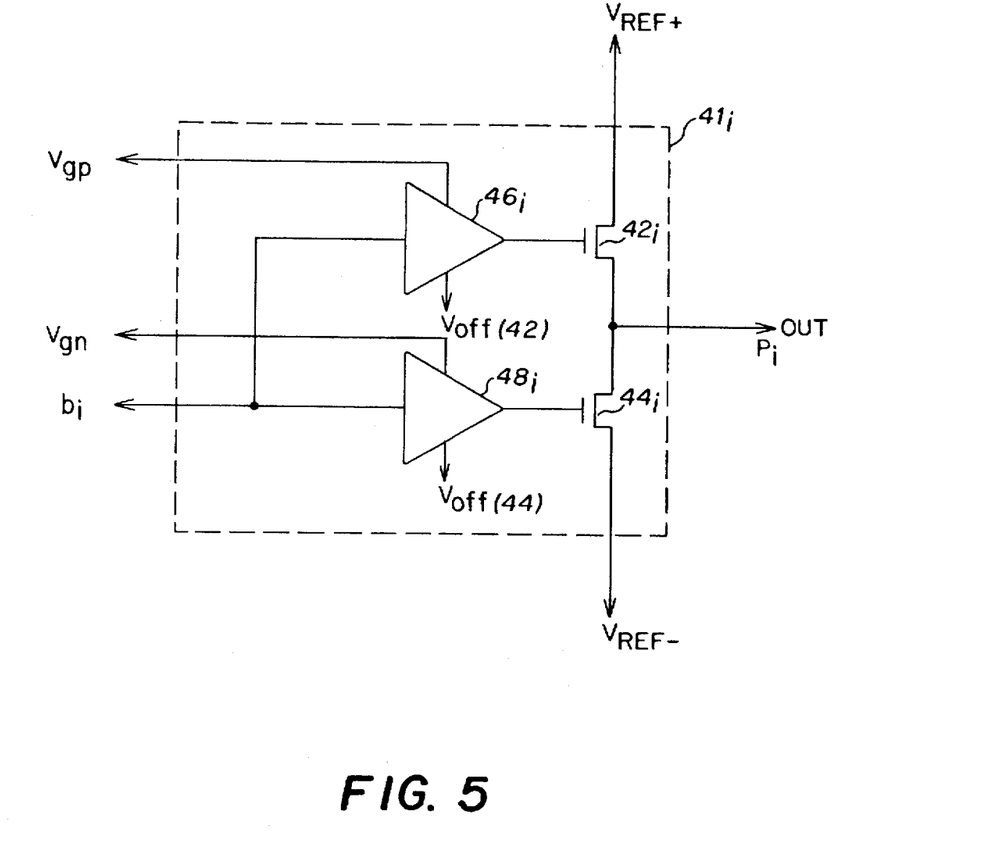
FIG. 5 is a general circuit diagram of an embodiment of the invention in which the MOSFETs of the switches of an R/2R DAC each have a controlled on resistance.

FIG. 5 illustrates an embodiment of the invention. In FIG. 5, a switch $41_i$ of a DAC includes a high reference MOSFET $42_i$ coupled to Vref+, and a low reference MOSFET $44_i$ coupled to Vref−. The term "high reference" and "low reference" with respect to MOSFETs $42_i$, $44_i$ refer to the voltage reference to which the MOSFETs are connected, and is not meant to imply any high or low characteristics of the devices themselves. The gate of high reference MOSFET $42_i$ is driven by a driver $46_i$, the output of which switches between a voltage approaching Vgp and a voltage approaching off voltage Voff of MOSFET $42_i$. The gate of low reference MOSFET $44_i$ is driven by a driver $48_i$, the output of which switches between a voltage approaching Vgn and a voltage approaching an off voltage Voff of MOSFET $44_i$. With such an arrangement, the on resistance of both high reference MOSFET $42_i$ and low reference MOSFET $44_i$ can be independently controlled.

Figure 6:
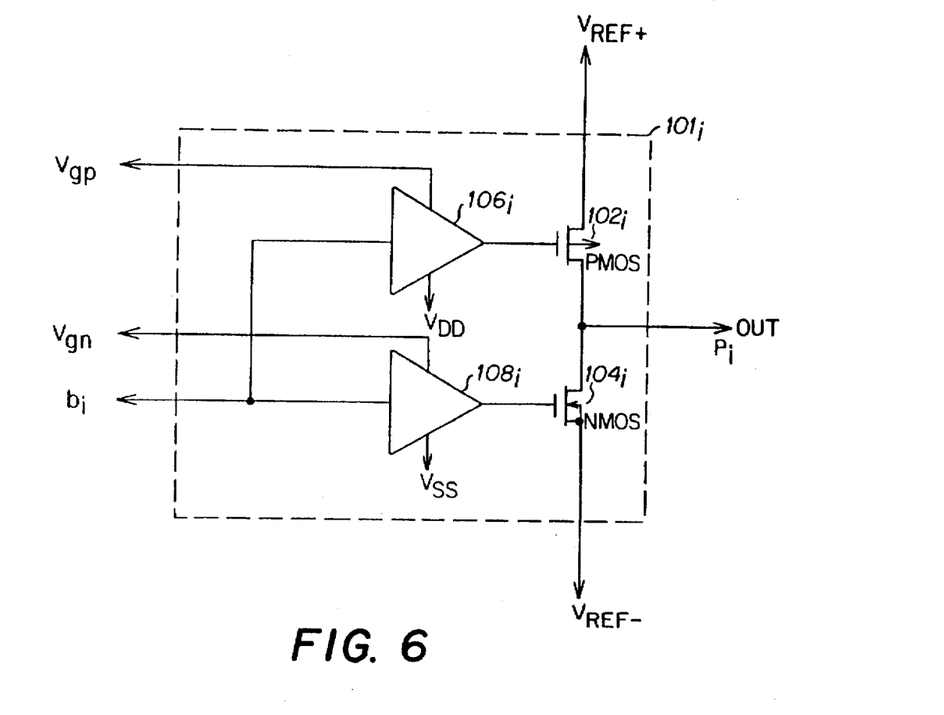
FIG. 6 is a diagram of a circuit of the type as shown in FIG. 5 for an PMOS/NMOS DAC.

FIG. 6 illustrates a circuit similar to that shown in FIG. 5, but for an example in which switch $101_i$ is for a PMOS/NMOS DAC. In such an arrangement, PMOS device $102_i$ and NMOS device $104_i$ are connected in series between Vref+ and Vref−. PMOS driver $106_i$ receives as an input bit signal $b_i$, and has an output connected to the gate of PMOS device $102_i$ that switches between a voltage approaching Vgp and a voltage approaching $V_{DD}$. NMOS driver $108_i$ receives as an input bit signal $b_i$, and has an output connected to the gate of NMOS device $104_i$ that switches between a voltage approaching Vgn and a voltage approaching Vss. Instead of $V_{DD}$, PMOS driver $106_i$ may be connected to any appropriate off voltage, such as any voltage higher than Vref+. Similarly, instead of Vss, NMOS driver $108_i$ may be connected to any appropriate off voltage, such as a voltage lower than Vref−.

Figure 7:
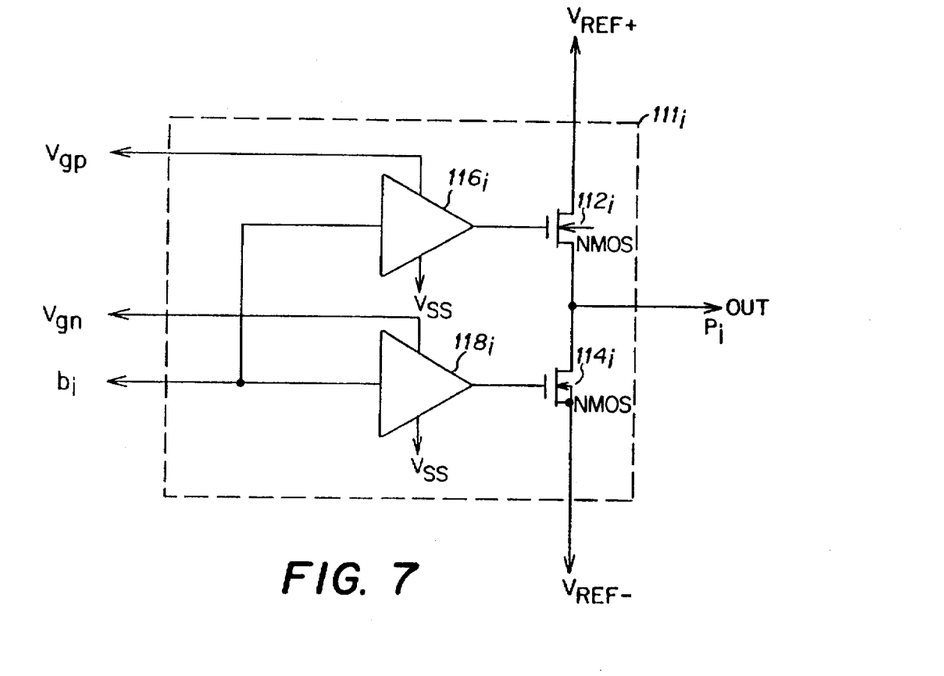
FIG. 7 is a diagram of a circuit of the type as shown in FIG. 5 for a NMOS/NMOS DAC.

FIG. 7 illustrates a circuit similar to that shown in FIG. 5, but for an example in which switch $111_i$ is for a NMOS/NMOS DAC. In such an arrangement, high reference NMOS device $112_i$ and low reference NMOS device $114_i$ are connected in series between Vref+ and Vref−. High reference driver $116_i$ receives as an input bit signal $b_i$, and has an output connected to the gate of high reference NMOS device $112_i$ that switches between a voltage approaching Vgp and a voltage approaching Vss. Low reference driver $118_i$ receives as an input bit signal $b_i$, and has an output connected to the gate of high reference NMOS device $114_i$ that switches between a voltage approaching Vgn and a voltage approaching Vss. Instead of Vss, high reference driver $116_i$ and low reference driver $118_i$ may be connected to any appropriate off voltage, such as a voltage lower than Vref−.

Figure 8:
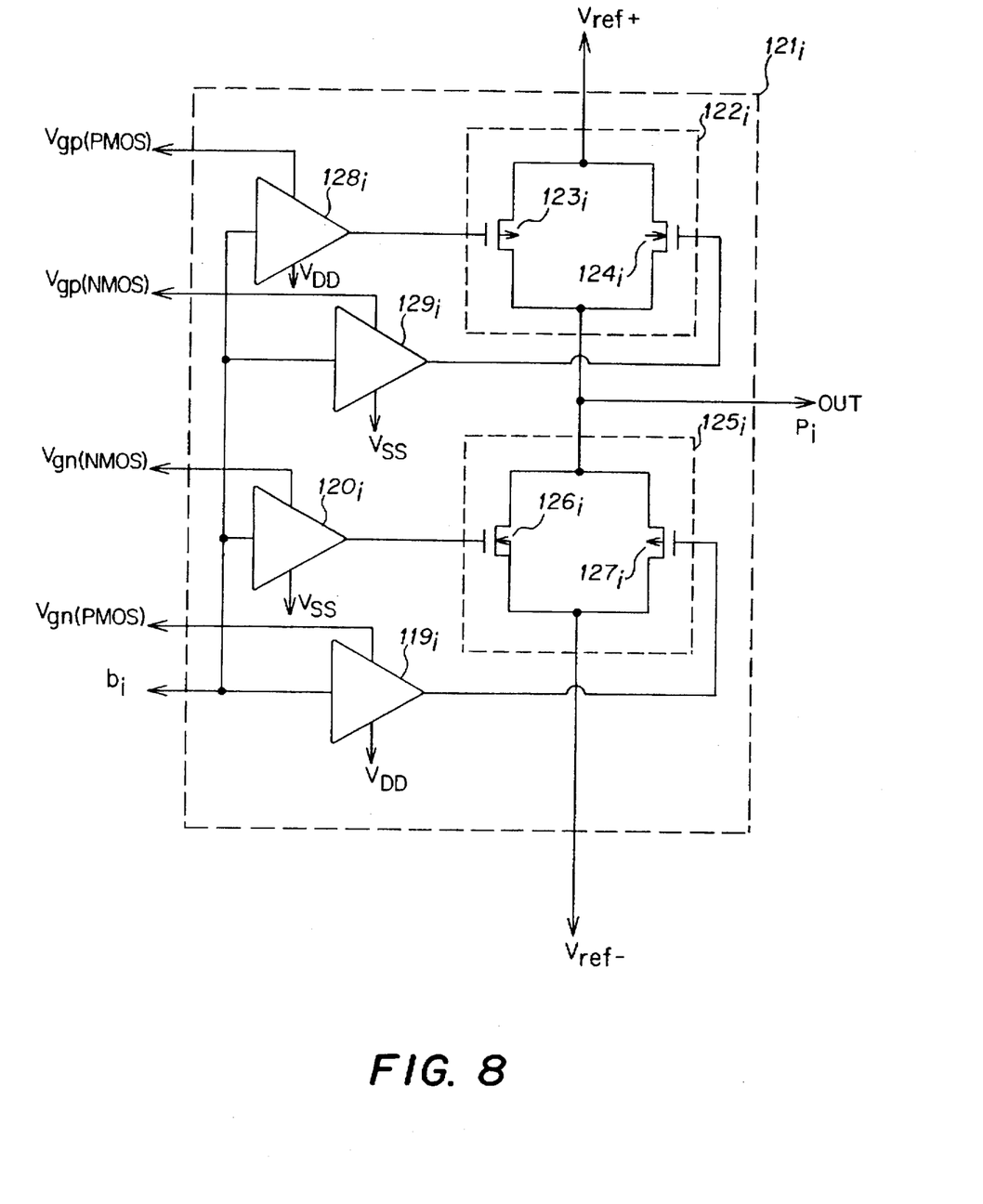
FIG. 8 is a diagram of a circuit of the type as shown in FIG. 5 for a DAC using transmission gates.

FIG. 8 illustrates another circuit similar to that shown in FIG. 5, but for an example in which switch $121_i$ is for a DAC that utilizes transmission gates. In such an arrangement, high reference transmission gate $122_i$ and low reference transmission gate $125_i$ are connected in series between Vref+ and Vref−. High reference transmission gate $122_i$ includes a parallel-connected pair including PMOS device $123_i$ and NMOS device $124_i$, and low reference transmission gate $125_i$ includes a parallelconnected pair including NMOS device $126_i$ and PMOS device $127_i$. In such an arrangement, four reference drivers may be provided to drive the transmission gates, including high PMOS driver $128_i$, high NMOS driver $129_i$, low NMOS driver $120_i$, and low PMOS driver $119_i$. As with the circuits of FIGS. 6 and 7, each reference driver $128_i$, $129_i$, $120_i$, $119_i$ receive as an input bit signal $b_i$, and provides an output appropriate for the device being driven. Also, instead of $V_{DD}$ and Vss, the reference drivers may be connected to any off voltage appropriate for the device being driven. In the circuit shown in FIG. 8, four different reference on voltages (Vgp(PMOS), Vgp(NMOS), Vgn(PMOS), and Vgn (NMOS)) are generated, to separately control each of the devices of the transmission gates $122_i$, $125_i$ via the respective reference driver.

Figure 9:
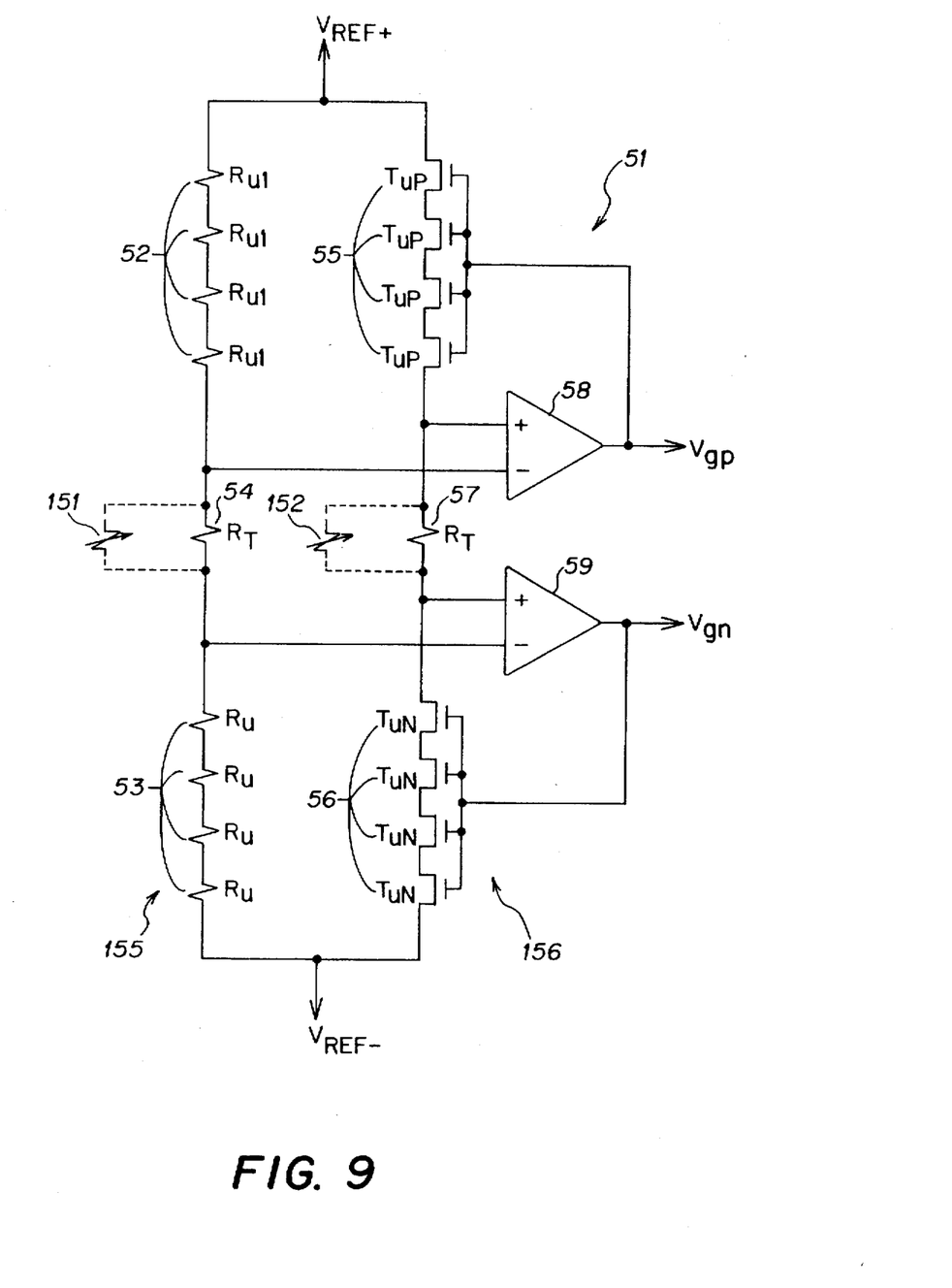
FIG. 9 illustrates a circuit for generating the gate voltages to control the on resistance of the circuits of FIGS. 5–8.

FIG. 9 shows a circuit 51 for generating voltages Vgp and Vgn that are provided to the drivers $46_i$, $48_i$ of the circuits of FIGS. 5–8. In FIG. 9, a first resistance leg 155 of the circuit includes several unit resistors 52 arranged in series, connected to several more unit resistors 53 arranged in series, and a reference resistor 54. A unit transistor leg 156 of the circuit 51 includes several unit transistors 55 connected in series, and connected to several unit transistors 56 and reference resistor 57. The number of unit resistors 52 is related to the number of unit transistors 55, and the number of unit resistors 53 is related to the number of unit transistors 56. In one embodiment, there is a single resistor 52, a single resistor 53, and four each of unit transistors 55 and unit transistors 56. Additionally, each of the unit transistors 55 is made with similar process control to match the characteristics of high reference MOSFET $42_i$, and each of the unit transistors 53 is made with similar process control to match the characteristics of low reference MOSFET $44_i$. The reference resistors 54, 57, may be manufactured to have closely matched values of resistance, and may be further trimmed either during manufacturing process or during use by a user, to have closely matched resistances, or to otherwise reduce INL error. For example, if there were other sources of INL error other than MOSFET device interaction, the adjustment of the resistance of reference resistors 54, 57 may reduce or eliminate these errors. If there is little other error, then the resistance of reference resistors 54, 57 may be adjusted to match the resistance of the ladder resistors $R_L$ under midscale conditions. FIG. 9 also shows adjustable resistor 151 in parallel with reference resistor 54 and adjustable resistor 152 in parallel with reference resistor 57, for an embodiment in which a user can adjust INL error.

In operation, the first operational amplifier 58 controls the gate voltage of unit transistors 55 to each have an on resistance controlled according to the resistance of each unit resistor 52, by providing positive gate voltage Vgp. Additionally, the second operational amplifier 59 controls the gate voltage of unit transistors 56 to each have an on resistance related to the resistance of each unit resistor 53 by providing negative gate voltage Vgn. The voltages Vgp and Vgn may also be further buffered in order to improve transient performance. Gate voltage Vgp and Vgn, either buffered or unbuffered, are each provided to the switch $41_i$ of FIG. 5. In one embodiment, in which there are an equal number of unit resistors 52 and unit transistors 55, as well as an equal number of unit resistors 53 and unit transistors 56, the on resistance of high reference MOSFET $42_i$ is controlled to be substantially equal to the resistance of unit resistor 52, and the on resistance of low reference MOSFET $42_i$ is controlled to be substantially equal to the resistance of unit resistor 53. As a result, this embodiment provides a technique for compensating for the switch interaction of MOSFETs $42_i$, $44_i$. Other quantities of unit resistors 52 and unit transistors 55 may be implemented in order to achieve different scaling effects. The same is true for the quantities of unit resistors 53 and unit transistors 56.

In one embodiment, the resistance of unit resistors 52 matches the resistance of unit resistors 53, so that the on resistance of high reference MOSFET $42_i$ matches the on resistance of low reference MOSFET $44_i$. Since many types of resistors have resistance characteristics that are more independent of temperature and voltage than MOSFET devices, this arrangement will provide an on resistance which is more stable over temperature and voltage variations. Additionally, resistors are not susceptible to the same type of MOSFET device interaction described earlier, which causes non-linearities in DAC performance.

In another embodiment, each of reference resistors 54 and 57 is a thin-film resistor, and may be trimmed during manufacturing via a laser-controlled process if desired. The trimming may be avoided, if desired, when the values of the manufactured resistances of resistors 54 and 57 are sufficiently matched. Alternatively, the reference resistors 54 and 57 may be any of a number of known types of adjustable resistors, shown on FIG. 9 as adjustable resistors 151 and 152, such as potentiometers or digitally-tuned resistors, that may be adjusted by the user.

An example of a digitally-tuned resistor is a resistor network having resistors disposed in a parallel, serial, or combination arrangement, with each resistor of the resistor network also being connected in parallel to a switch such as a MOSFET device. The switches are controlled to selectively switch resistors in and out by short-circuiting selected resistors, which in turn varies the total resistance of the resistor network.

Additionally, instead of reference resistors 54 and 57 being thin-film resistors, these may be diffused resistors, which have approximately the same temperature characteristics as MOSFETs, and use less space on a DAC chip. Such an embodiment may be desired, for example, in order to reduce the size of the DAC chip and allow even closer matching between the on resistance of the MOSFETs and the unit resistors during temperature variations.

Figure 10:
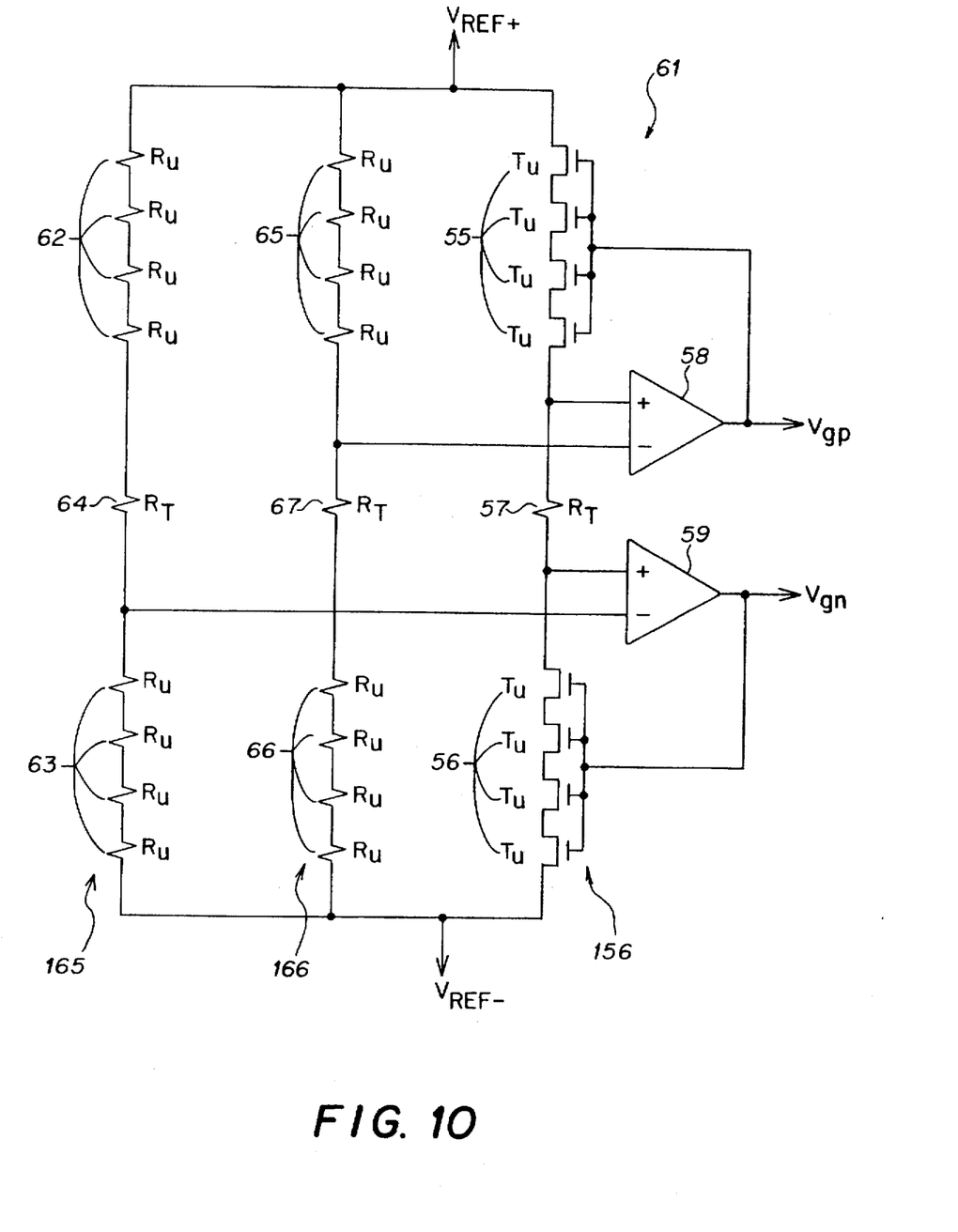
FIG. 10 illustrates an alternative circuit to the circuit of FIG. 9, in which the on resistance of each of the MOSFETs of FIGS. 5–8 are separately controlled.

FIG. 10 illustrates an alternative circuit to the circuit of FIG. 9, for an embodiment in which the on resistance of each of the MOSFETs of FIGS. 5–8 is separately controlled. The circuit 61 of FIG. 10 is similar to the circuit 51 of FIG. 9, but there are two resistance legs 165, 166 instead of one. One resistance leg 165 includes unit resistors 62 arranged in series and connected to reference resistor 64 and unit resistors 63, also arranged in series. Another resistance leg 166 includes unit resistors 65 arranged in series and connected to reference resistor 67 and unit resistors 66 arranged in series. The unit transistor leg 156 is similar to the unit transistor leg 156 of circuit 51, including unit transistors 55, 56, and reference resistor 57, arranged in series. With this structure, reference resistor 64 may be trimmed to adjust the on resistance of low reference MOSFET $44_i$, and reference resistor 67 may be trimmed separately from reference resistor 64 in order to adjust the on resistance of high reference MOSFET $42_i$. As with the circuit of FIG. 9, the reference resistors may be thin-film or diffused, and may be adjusted during manufacturing or during use by a user. Additionally, the number of unit resistors 62, 63 and unit resistors 65, 66 may be selected with respect to the number of unit transistors 55, 56, in order to achieve a desired scaling factor between the unit resistors 62, 63, 65, 66 and the unit transistors 55, 56.

Additional legs may be added to either the circuit of FIG. 9 or the circuit of FIG. 10 to provide additional voltages to control transmission gates such as those depicted in FIG. 8. Thus, the unit transistors 55, 56 may be PMOS devices in one leg, and NMOS devices in another leg.

Figure 11:
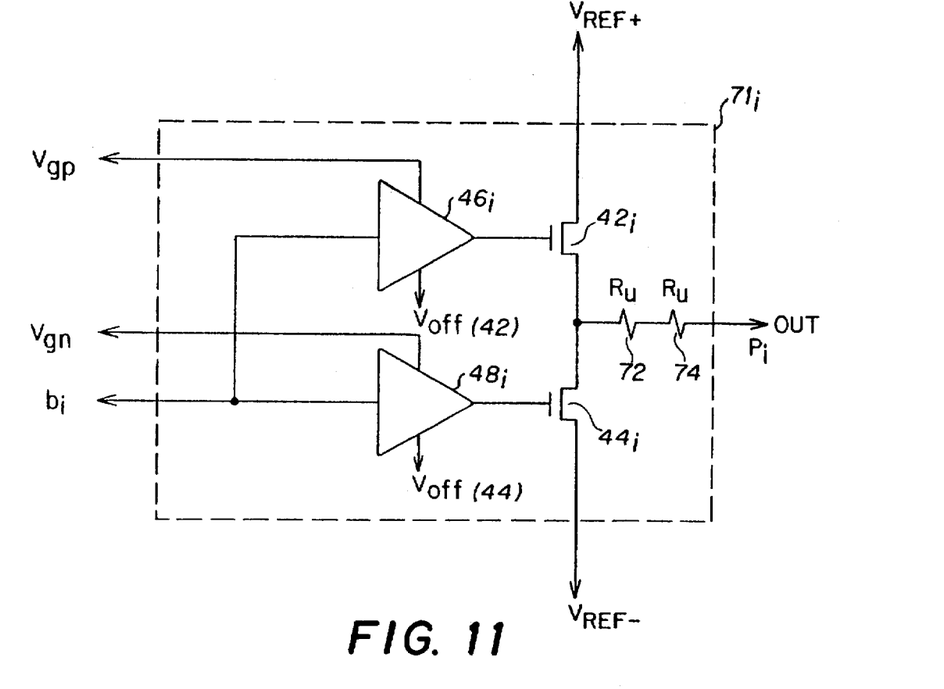
FIG. 11 shows an embodiment of the invention in which a resistor provides matching of the resistance of different legs of a R/2R DAC.

FIG. 11 depicts another embodiment of the invention that includes switch circuit $71_i$ similar to switch circuit $41_i$, but with additional unit resistors 72, 74 disposed between the node that connects high reference MOSFET $42_i$ to low reference MOSFET $44_i$. These unit resistors 72, 74 may be used in place of or in conjunction with unit transistors which were used as known in the related art to properly scale the resistance of each switch $S_i$ connected to the resistance ladder. Although two unit resistors are shown in FIG. 11, any number may be provided to achieve the desired total on resistance of each switch $S_i$. Additionally, a number of unit transistors may also be disposed in series, in parallel, or in a combination of series and parallel along with unit resistors 72, 74, which also may be arranged in series, in parallel, or in a combination of series and parallel. Unit resistors 72, 74 may be diffused or thin-film.

In one embodiment, drivers $46_i$, $48_i$ in conjunction with circuit 61 assure that the on resistance of high reference MOSFET $42_i$ and low reference MOSFET $44_i$ are equal to the unit resistors 72, 74. Accordingly, the on resistances of the switches $S_{1...n}$ may be controlled, and a DAC may be manufactured which has improved INL and DNL performance.

Other techniques than those specifically shown may be envisioned to control the on resistance of the MOSFET in relation to a reference value such as the resistance of a unit resistor, for example current sources or other circuits may provide a reference value of voltage or current. In such an instance, another device, also having a resistance value related to the reference value of the current source or other circuit, may then be provided for each switch $S_i$ as required, in order to achieve scaled switch on resistance. The circuit of FIG. 11 may be implemented as a PMOS/NMOS DAC such as that shown in FIG. 6, a NMOS/NMOS DAC such as that shown in FIG. 7, as a DAC using transmission gates such as that shown in FIG. 8, or a combination of these types of DACs.

Figure 12:
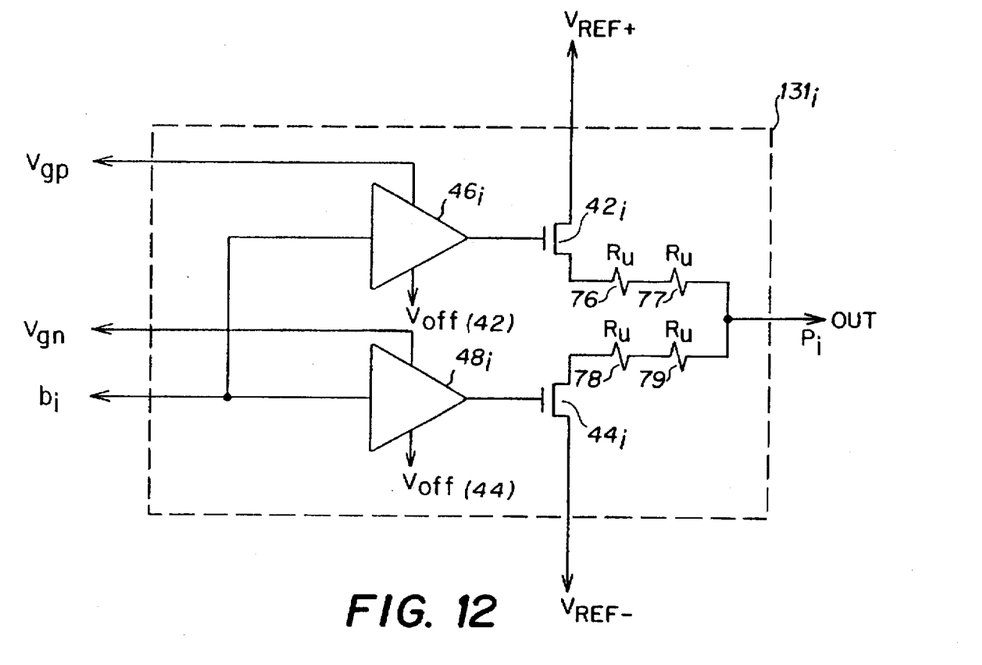
FIG. 12 shows an alternative circuit to the embodiment shown in FIG. 11.

FIG. 12 depicts an embodiment of a switch $131_i$, with a different unit resistor arrangement compared to that of FIG. 11 In the circuit of FIG. 12, high reference MOSFET $42_i$ is not connected directly to low reference MOSFET $44_i$. Instead, unit resistors 76, 77 connect the output of high reference MOSFET $42_i$ to the output $P_i$ of switch $131_i$, and unit resistors 78, 79 connect the output of low reference MOSFET $44_i$ to the output $P_i$ of switch $131_i$.

Figure 13:
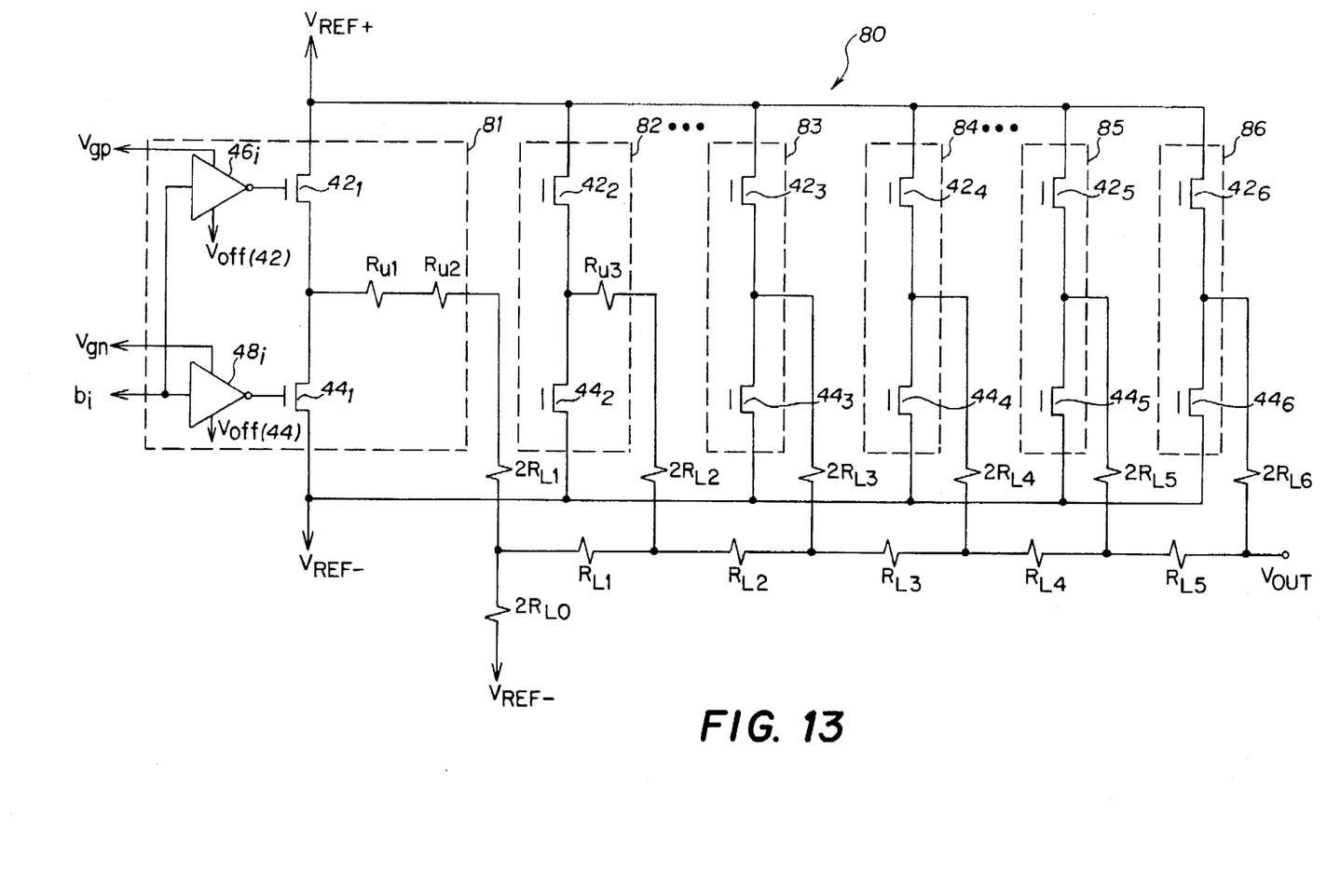
FIG. 13 shows an embodiment of the invention in which a DAC includes a combination of transistor scaling techniques, resistors, and controlled on resistances for the scaling of each switch of the different legs of an R/2R resistance ladder.

In one embodiment of the invention, a DAC 80 is structured as shown in FIG. 13. FIG. 13 illustrates an R/2R ladder DAC 80 which includes several stages of ladder switches 81, 82, 83, 84, 85, 86. LSB switch 81 is configured as in switch 71, and includes unit resistors $R_{U1}$ and $R_{U2}$, and may also include scaled MOSFET devices or a number of MOSFET devices in series or in parallel with unit resistors $R_{U1}$ and $R_{U2}$ to achieve appropriate resistance scaling. The next LSB switch 82 may be configured similar to LSB switch 81, with only a single unit resistor $R_{U3}$. Intermediate switches 83, 84 may include scaled switches only, or non-scaled switches with unit resistors. MSB (Most Significant Bit) switches 85, 86 may be simple MOSFET transistors as known in the art. In FIG. 13, only the gates of high reference MOSFET $42_1$ and and low reference MOSFET $44_1$ are shown connected for purposes of clarity; the gates of high reference MOSFETs $42_2$–$42_6$ and low reference MOSFETs $44_2$–$44_6$ are similarly driven.

For example, switch 81 may include two unit resistors $R_{U1}$, $R_{U2}$, as well as two MOSFETs in series, each controlled by a circuit such as circuit 51 or 61. Switch 83 may include a single unit resistor $R_{U3}$ and two gate-controlled MOSFETs. Switch 83 may include two gate-controlled MOSFETs, and switch 84 may include a single gate-controlled MOSFET. In such an approach, the W/L characteristics of each of the gate-controlled MOSFETs may be substantially identical, so that a binary weighting is achieved between the switches 81–84. MSB switches 85, 86 may then be implemented using W/L scaling techniques, or any combination of the above-described techniques. Also, at the MSB end, the series resistors $R_{L4}$ and $R_{L5}$ may be eliminated to segment the DAC, as it is known in the art, and the switch on resistances would be scaled accordingly.

In accordance with an embodiment of the invention, the adverse effects of MOSFET device interaction have been reduced. Accordingly, the technique of binary scaling on resistance of the MOSFET devices, such as shown in FIG. 1, may be implemented very effectively, and alternate scaling techniques may not be necessary. However, any combination of resistors, gate-controlled MOSFETs, and scaling techniques may be implemented to achieve various scales, such as logarithmic scaling or any desired scaling factor.

Having thus described several embodiments of the invention, various alterations, modifications, and improvements will readily occur to those skilled in the art. Such alterations, modifications, and improvements are intended to be within the spirit and scope of the invention. For example, this architecture may be used in a combination DAC which uses an R/2R structure in combination with another structure such as weighted resistance, as well as R/3R DACs, or any switched resistor device. Accordingly, the foregoing description is by way of example only, and not intended to be limiting. The invention is limited only as defined in the following claims and the equivalents thereto.

What is claimed is:

1. A circuit for providing switching of resistance legs of an R/2R resistance ladder of a digital-to-analog converter to a first voltage reference and a second voltage reference, the circuit comprising:

a plurality of switches, each of the plurality of switches including a first MOSFET device coupled to the first voltage reference and operable to couple the first voltage reference to a respective one of the resistance legs, and a second MOSFET device coupled to the second voltage reference and operable to couple the second voltage reference to the respective one of the resistance legs; and a control circuit that generates a first gate voltage that is provided to the first MOSFET device of the first one of the plurality of switches, and to the first MOSFET device of a second one of the plurality of switches, so that an on resistance of each of the first MOSFET devices of the first and second switches is controlled with respect to a reference value, the control circuit further generating a second gate voltage that is provided to the second MOSFET device of the first of the plurality of switches and to the second MOSFET device of the second of the plurality of switches, so that an on resistance of each of the second MOSFET devices of the first and second switches is controlled with respect to the reference value.

2. The circuit of claim 1 wherein the first MOSFET devices are of a first MOS type and the control circuit includes:

a reference resistor having a resistance indicative of the reference value;

a reference MOSFET device that is of the first MOS type; and a comparison circuit coupled to the reference resistor and the reference MOSFET device, the comparison circuit having an output that provides the first gate voltage.

3. The circuit of claim 2 wherein the second MOSFET devices are of a second MOS type and the control circuit further includes:

a second reference resistor having a resistance indicative of the reference value;

a second reference MOSFET device that is of the second MOS type; and a second comparison circuit coupled to the second reference resistor and the second reference MOSFET device, the second comparison circuit having an output that provides the second gate voltage.

4. The circuit of claim 3 wherein at least one of the first and second reference resistors is trimmable to adjust an integral non-linearity of the digital-to-analog converter.

5. The circuit of claim 3 wherein at least one of the first and second reference resistors is trimmable externally by a user to adjust an integral non-linearity of the digital-to-analog converter.

6. The circuit of claim 1 wherein the R/2R resistance ladder includes a termination leg having a permanently on MOSFET coupled to the termination leg and coupleable to the second voltage reference, and wherein the on resistance of the first and second MOSFET devices of a switch $S_i$ of the plurality of switches are controlled so that a total resistance of the switch $S_i$ is equal to a value that is $2^{(j-i)}$ times a total resistance of a switch $S_j$ of the plurality of switches, where i and j represent respective bit positions of switches $S_i$ and $S_j$.

7. The circuit of claim 1 wherein each of the first MOSFET devices is one of an NMOS device and a PMOS device and each of the second MOSFET devices is one of an NMOS device and a PMOS device.

8. The circuit of claim 1 wherein:

the first MOSFET device of one of the plurality of switches is an NMOS device; and the one of the plurality of switches further includes a PMOS device arranged in parallel with the NMOS device, to form a transmission gate.

9. The circuit of claim 1, further comprising a series resistor series coupled between the first MOSFET device of a first one of the plurality of switches and a first one of the resistance legs.

10. The circuit of claim 1, wherein the reference value is substantially equal to a resistance of the series resistor.

11. A method for weighting resistance in a plurality of switches each of which (a) couples a corresponding resistance leg of an R/2R resistor ladder to a first voltage reference by a first MOSFET device, and (b) couples the corresponding resistance leg to a second voltage reference by a second MOSFET device, the method comprising the steps of:

providing a unit resistance that couples a first switch of the plurality of switches to a corresponding resistance leg;

controlling the on resistance of each of the MOSFET devices of the first switch to depend upon the unit resistance; and controlling the on resistance of each of the MOSFET devices of a second switch of the plurality of switches to depend upon the unit resistance.

12. The method of claim 11 wherein the first step of controlling includes the steps of:

providing at least one reference resistor having a reference resistance;

providing at least one reference MOSFET device having a unit MOSFET reference resistance that is controlled according to a gate voltage of the at least one MOSFET device;

adjusting the gate voltage of the at least one reference MOSFET device so that the unit MOSFET reference resistance is substantially equal to the reference resistance; and providing the gate voltage to a gate of each of the MOSFET devices of the first switch.

13. The method of claim 12 wherein the step of adjusting is performed during a manufacturing process.

14. The method of claim 12 wherein the step of adjusting is performed by a user.

15. The method of claim 11 wherein the unit resistance includes a thin-film resistor.

16. The method of claim 11 wherein the unit resistance includes a diffused resistor.

17. The method of claim 11 wherein the unit resistance includes providing a plurality of resistors arranged in one of a series arrangement, a parallel arrangement, and a combination series and parallel arrangement.

18. An apparatus for weighting resistance in a plurality of switches each of which (a) couples a corresponding resistance leg of an R/2R resistor ladder to a first voltage reference by a first MOSFET device, and (b) couples the respective resistance leg to a second voltage reference by a second MOSFET device, the apparatus comprising:

a unit resistor coupled between a first switch of the plurality of switches and a corresponding resistor leg;

first means for controlling the on resistance of each of the MOSFET devices of the first switch to depend upon the resistance of the unit resistor; and second means for controlling the on resistance of each of the MOSFET devices of a second switch of the plurality of switches to depend upon the resistance of the unit resistor.

19. The apparatus of claim 18 wherein the first means includes:

at least one reference resistor having a unit resistance;

at least one reference MOSFET device having a unit MOSFET reference resistance that is controlled according to a gate voltage of the at least one MOSFET device;

means for adjusting the gate voltage of the at least one reference MOSFET device so that the unit MOSFET reference resistance is substantially equal to the unit resistance; and means for providing the gate voltage to a gate of each of the MOSFET devices of the first switch.

20. The apparatus of claim 19 wherein the means for adjusting includes means for adjusting during a manufacturing process.

21. The apparatus of claim 20 wherein the means for adjusting includes means for adjusting by a user.

22. The apparatus of claim 18 wherein the unit resistor includes a thin-film resistor.

23. The apparatus of claim 18 wherein the unit resistor includes a diffused resistor.

24. The apparatus of claim 18 wherein the unit resistor includes a plurality of resistors arranged in one of a series arrangement, a parallel arrangement, and a combination series and parallel arrangement.

25. A switch for coupling a resistor leg of an R/2R resistor ladder to a first voltage reference and a second voltage reference according to a bit select signal, the switch comprising:

a first transistor having a first terminal connected to the first voltage reference, a second terminal, and a third terminal coupled to the resistor leg;

a second transistor having a first terminal connected to the second voltage reference, a second terminal, and a third terminal connected to the third terminal of the first transistor;

a first driver having an input that receives the bit select signal and an output connected to the second terminal of the first transistor, the first driver controlling the first transistor to have an on resistance controlled to depend upon a reference value; and a second driver having an input that receives the bit select signal and an output connected to the second terminal of the second transistor, the second driver controlling the second transistor to have an on resistance controlled to depend upon the reference value.

26. The switch of claim 25 wherein the reference value is a resistance of a reference resistor.

27. The switch of claim 25 further comprising a unit resistor that couples the third terminal of the first transistor to the resistor leg.

28. The switch of claim 27 wherein the unit resistor is a thin-film resistor.

29. The switch of claim 27 wherein the unit resistor is a diffused resistor.

30. The switch of claim 25 wherein the first transistor is one of an NMOS transistor and a PMOS transistor and the second transistor is a NMOS device.

31. The switch of claim 25 wherein, the first transistor is an NMOS device, the switch further comprising a PMOS device arranged in parallel with the NMOS device, to form a transmission gate.

* * * * *